United States Patent
Podhajny et al.

(10) Patent No.: US 10,577,732 B1
(45) Date of Patent: Mar. 3, 2020

(54) KNIT FABRIC WITH ELECTRICAL COMPONENTS

(71) Applicant: Apple Inc., Cupertino, CA (US)

(72) Inventors: Daniel A. Podhajny, San Jose, CA (US); Daniel D. Sunshine, Sunnyvale, CA (US); Yohji Hamada, Wakayama (JP)

(73) Assignee: Apple Inc., Cupertino, CA (US)

( * ) Notice: Subject to any disclaimer, the term of this patent is extended or adjusted under 35 U.S.C. 154(b) by 196 days.

(21) Appl. No.: 15/441,021

(22) Filed: Feb. 23, 2017

Related U.S. Application Data

(60) Provisional application No. 62/300,236, filed on Feb. 26, 2016.

(51) Int. Cl.
| | | |
|---|---|---|
| *D04B 21/14* | (2006.01) | |
| *H05K 1/03* | (2006.01) | |
| *H05K 3/02* | (2006.01) | |
| *H05K 1/18* | (2006.01) | |
| *H05K 3/34* | (2006.01) | |
| *H05K 1/11* | (2006.01) | |
| *F21V 23/06* | (2006.01) | |
| *F21V 19/00* | (2006.01) | |
| *F21V 33/00* | (2006.01) | |

(52) U.S. Cl.
CPC .......... *D04B 21/14* (2013.01); *F21V 19/0025* (2013.01); *F21V 23/06* (2013.01); *F21V 33/00* (2013.01); *H05K 1/038* (2013.01); *H05K 1/111* (2013.01); *H05K 1/189* (2013.01); *H05K 3/341* (2013.01); *H05K 2201/10106* (2013.01)

(58) Field of Classification Search
CPC ...... F21V 19/0025; F21V 23/06; F21V 33/00; H05K 1/038; H05K 1/189; H05K 3/341; D04B 21/14
USPC ........................................................ 362/103
See application file for complete search history.

(56) References Cited

U.S. PATENT DOCUMENTS

| | | | |
|---|---|---|---|
| 4,715,235 A | 12/1987 | Fukui et al. | |
| 6,360,615 B1 | 3/2002 | Smela | |
| 7,783,334 B2 | 8/2010 | Nam et al. | |
| 8,032,199 B2 | 10/2011 | Linti et al. | |
| 8,291,779 B2 | 10/2012 | Helmer et al. | |
| 2003/0211797 A1* | 11/2003 | Hill ...................... | D03D 1/0088 442/205 |
| 2005/0081913 A1 | 4/2005 | Ebbesen et al. | |
| 2007/0089800 A1 | 4/2007 | Sharma | |
| 2010/0013406 A1* | 1/2010 | Bhattacharya ....... | D03D 1/0088 315/291 |

* cited by examiner

*Primary Examiner* — Karabi Guharay
(74) *Attorney, Agent, or Firm* — Treyz Law Group, P.C.; G. Victor Treyz; Tianyi He

(57) ABSTRACT

Conductive yarns in a knitted fabric may include insulating cores covered with metal layers that form signal paths. Open circuits may be formed in the yarns by removing metal from the insulating cores at selected locations within the yarns. The fabric may be formed from rows of interlocked loops of the yarn. The open circuits may be located on the loops so that each loop with an open circuit has a first segment of the metal layer that is separated from a second segment of the layer by a portion of the loop from which the metal layer has been removed. Each electrical component may have terminals that span a respective one of the open circuits and that are shorted respectively to the metal of the first and second segments.

20 Claims, 35 Drawing Sheets

KNIT FABRIC WITH ELECTRICAL COMPONENTS

This patent application claims the benefit of provisional patent application No. 62/300,236, filed on Feb. 26, 2016, which is hereby incorporated by reference herein in its entirety.

FIELD

This relates generally to fabric-based items and, more particularly, to fabric-based items with electrical components.

BACKGROUND

It may be desirable to form bags, furniture, clothing, and other items from materials such as fabric. Fabric-based items generally do not include electrical components. It may be desirable, however, to incorporate electrical components into a fabric-based item to provide a user of a fabric-based item with enhanced functionality.

It can be challenging to incorporate electrical components into a fabric-based item. Fabric is flexible, so it can be difficult to mount structures to fabric. Electrical components must be coupled to signal paths, but it can be difficult to satisfactorily attach components to conductive strands of material.

SUMMARY

A fabric-based item may include fabric such as knitted fabric. The knitted fabric may be formed from conductive yarns and insulating yarns. Conductive yarns may form signal paths and may include insulating cores covered with conductive coatings such as metal coatings.

Open circuits may be formed in the yarns by removing metal from the insulating cores at selected locations within the yarns. Each loop with an open circuit will have a first portion of the metal that is electrically isolated from a second portion of the metal by a gap. Electrical components can be coupled to loops. Each electrical component may span a respective open circuit in a loop and may have a first terminal that is coupled to the first portion of metal in the loop and a second terminal that is coupled to the second portion of metal in the loop.

DETAILED DESCRIPTION

Figure 1:
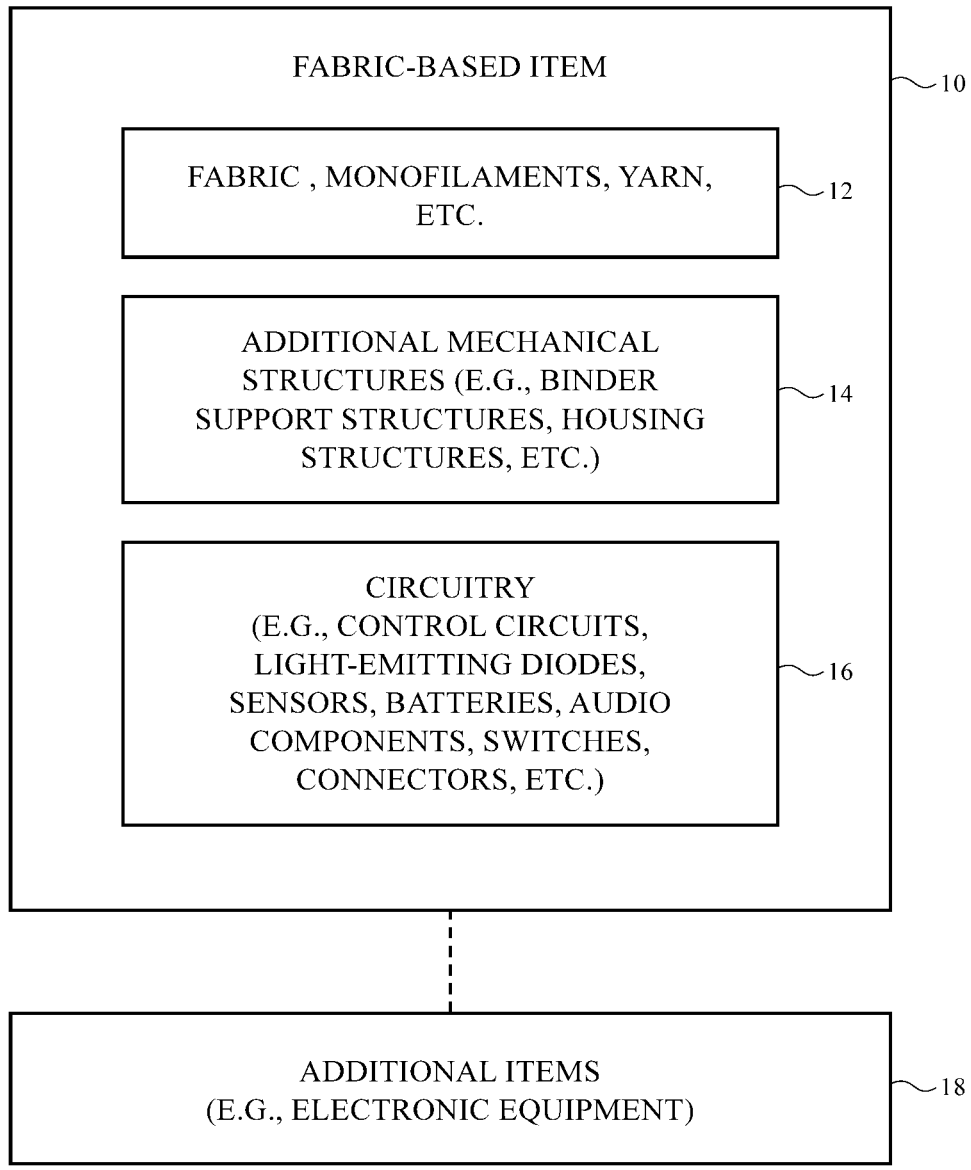
FIG. 1 is a schematic diagram of an illustrative fabric-based item in accordance with an embodiment.

Items such as item 10 of FIG. 1 may be based on fabric. Item 10 may be an electronic device or an accessory for an electronic device such as a laptop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which fabric-based item 10 is mounted in a kiosk, in an automobile, airplane, or other vehicle, other electronic equipment, or equipment that implements the functionality of two or more of these devices. If desired, item 10 may be a removable external case for electronic equipment, may be a strap, may be a wrist band or head band, may be a removable cover for a device, may be a case or bag that has straps or that has other structures to receive and carry electronic equipment and other items, may be a necklace or arm band, may be a wallet, sleeve, pocket, or other structure into which electronic equipment or other items may be inserted, may be part of a chair, sofa, or other seating (e.g., cushions or other seating structures), may be part of an item of clothing or other wearable item (e.g., a hat, belt, wrist band, headband, shirt, pants, shoes, etc.), or may be any other suitable fabric-based item.

Item 10 may include intertwined strands of material (yarns) that form fabric 12. Fabric 12 may form all or part of a housing wall or other layer in an electronic device, may form internal structures in an electronic device, or may form other fabric-based structures. Item 10 may be soft (e.g., item 10 may have a fabric surface that yields to a light touch), may have a rigid feel (e.g., the surface of item 10 may be formed from a stiff fabric), may be coarse, may be smooth, may have ribs or other patterned textures, and/or may be formed as part of a device that has portions formed from non-fabric structures of plastic, metal, glass, crystalline materials, ceramics, or other materials.

The strands of material in fabric 12, which may sometimes be referred to herein as yarns, may be single-filament strands (sometimes referred to as fibers or monofilaments) or may be strands of material formed by intertwining multiple monofilaments of material together.

The yarns in fabric 12 may be formed from polymer, metal, glass, graphite, ceramic, natural materials such as cotton or bamboo, or other organic and/or inorganic materials and combinations of these materials. Conductive coatings such as metal coatings may be formed on non-conductive material. For example, plastic yarns in fabric 12 may be coated with metal to make them conductive. Reflective coatings such as metal coatings may be applied to make yarns reflective. Yarns may be formed from bare metal wires or metal wire intertwined with insulating monofilaments (as examples). Bare metal strands and strands of polymer covered with conductive coatings may be provided with insulating polymer jackets.

Yarn may be intertwined to form fabric 12 using intertwining equipment such as weaving equipment, knitting equipment, or braiding equipment. Intertwined yarn may, for example, form knitted fabric. Conductive yarn and insulating yarn may be woven, knit, braided, or otherwise intertwined to form contact pads that can be electrically coupled to conductive structures in item 10 such as the contact pads of an electrical component.

Conductive yarn and insulating yarn may also be woven, knit, or otherwise intertwined to form conductive paths. The conductive paths may be used in forming signal paths (e.g., signal buses, power lines, etc.), may be used in forming part of a capacitive touch sensor electrode, a resistive touch sensor electrode, or other input-output device, or may be used in forming other patterned conductive structures. Conductive structures in fabric 12 may be used in carrying power signals, digital signals, analog signals, sensor signals, control signals, data, input signals, output signals, or other suitable electrical signals.

Item 10 may include additional mechanical structures 14 such as polymer binder to hold yarns in fabric 12 together, support structures such as frame members, housing structures (e.g., an electronic device housing), and other mechanical structures.

To enhance mechanical robustness and electrical conductivity at yarn-to-yarn connections, additional structures and materials (e.g., solder, crimped metal connections, welds, conductive adhesive such as anisotropic conductive film and other conductive adhesive, non-conductive adhesive, fasteners, etc.) may be used to help form yarn-to-yarn connections. These yarn-to-yarn connections may be formed where yarns cross each other perpendicularly or at other yarn intersections where connections are desired. Insulating material can be interposed between intersecting conductive yarns at locations in which it is not desired to form a yarn-to-yarn connection. The insulating material may be plastic or other dielectric, may include an insulating yarn or a conductive yarn with an insulating coating, etc. Solder connections may be formed between conductive yarns by melting solder so that the solder flows over conductive yarns. The solder may be melted using an inductive soldering head to heat the solder, using a reflow oven to heat the solder, using a laser or hot bar to heat the solder, or using other soldering equipment. During soldering, outer dielectric coating layers (e.g., outer polymer layers) may be melted away in the presence of molten solder, thereby allowing underlying metal yarns to be soldered together.

Circuitry 16 may be included in item 10. Circuitry 16 may include electrical components that are coupled to fabric 12, electrical components that are housed within an enclosure formed by fabric 12, electrical components that are attached to fabric 12 using welds, solder joints, conductive adhesive bonds, crimped connections, or other electrical and/or mechanical bonds. Circuitry 16 may include metal structures for carrying current, electrical components such as integrated circuits, light-emitting diodes, sensors, and other electrical devices. Control circuitry in circuitry 16 may be used to control the operation of item 10.

Item 10 may interact with electronic equipment or other additional items 18. Items 18 may be attached to item 10 or item 10 and item 18 may be separate items that are configured to operate with each other (e.g., when one item is a case and the other is a device that fits within the case, etc.). Control circuitry in circuitry 16 may be used to support communications with item 18 and/or other devices. Circuitry 16 may include antennas and other structures for supporting wireless communications with item 18. Item 18 may also interact with item 10 using a wired communications link or other connection that allows information to be exchanged.

In some situations, item 18 may be an electronic device such as a cellular telephone, computer, or other portable electronic device and item 10 may form a cover, case, bag, item of clothing, or other structure that receives the electronic device in a pocket, an interior cavity, or other portion of item 10. In other situations, item 18 may be a wristwatch device or other electronic device and item 10 may be a strap or other fabric-based item that is attached to item 18 (e.g., item 10 and item 18 may together form a fabric-based item such as a wristwatch with a strap). In still other situations, item 10 may be an electronic device, fabric 12 may be used in forming the electronic device, and additional items 18 may include accessories or other devices that interact with item 10. Signal paths formed from conductive yarns may be used to route signals in item 10 and/or item(s) 18.

Figure 2:
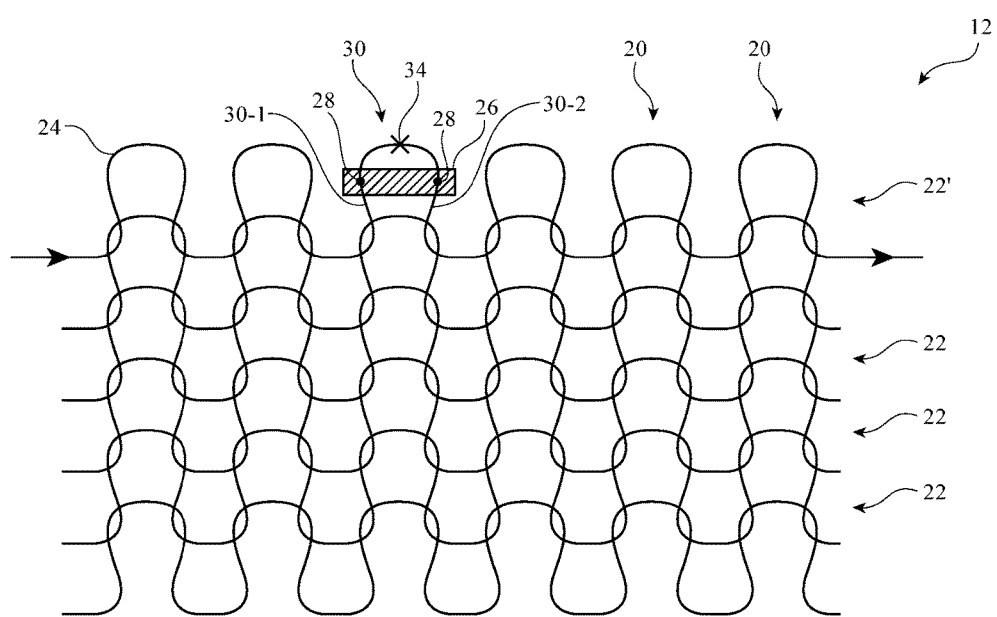
FIG. 2 is a top view of illustrative knitted fabric of the type that may be provided with electrical components in accordance with an embodiment.

The fabric that makes up item 10 may be formed from multifilament and/or monofilament yarns (strands) that are intertwined using any suitable intertwining equipment. With one suitable arrangement, which may sometimes be described herein as an example, fabric 12 may be knitted fabric formed using a knitting machine. A top view of illustrative knitted fabric 12 is shown in FIG. 2. In the illustrative configuration of FIG. 2, fabric 12 has a single layer of knitted yarns 24. Other fabric constructions may be used for fabric 12 if desired.

As shown in FIG. 2, fabric 12 may include yarns 24 or other strands of material that form horizontally extending rows of interlocking loops (courses 22) and vertically extending wales 20. Some or all of yarns 24 in fabric 12 such as yarn 24 in course 22' in the example of FIG. 2 may be conductive.

Some or all of the loops of conductive yarn in fabric 12 may be provided with electrical components such as illustrative component 26. Components in fabric 12 such as component 26 may be light-based components (e.g., light-emitting diodes and/or light detectors), may be sensors that sense temperature, pressure, force, capacitance, touch, magnetic field strength, motion, other suitable sensors, integrated circuits with sensors and/or light-based components, integrated circuits with communications circuitry and/or control circuitry, and/or other electrical devices.

Components such as component 26 may have any suitable number of terminals. For example, component 26 may have a pair of terminals such as terminals 28. Component 26 may be mounted to yarn loop 30 so that a first of terminals 28 is electrically shorted to yarn loop portion 30-1 and a second of terminals 28 is electrically shorted to yarn loop portion 30-2. For example, solder or other conductive material may be used to couple terminals 28 to metal in yarn portions 30-1 and 30-1.

The metal or other conductive material of yarn 24 in course 22' may be selectively removed in the vicinity of component 26 between portions 30-1 and 30-2 to create an open circuit such as open circuit 34. In the presence of open circuit 34, signals can pass through component 26 (i.e., signals can pass from one terminal of component 26 to the other), but will not pass through the portion of loop 30 that extends between yarn loop portion 30-1 and yarn loop portion 30-2. The formation of open circuit 34 therefore ensures that terminals 28 will not be shorted to each other by yarn 24 and allows component 26 to operate satisfactorily. Control circuitry in circuitry 16 (FIG. 1) may be used in controlling the application of signals to component 26 via yarn 24.

Figure 3:
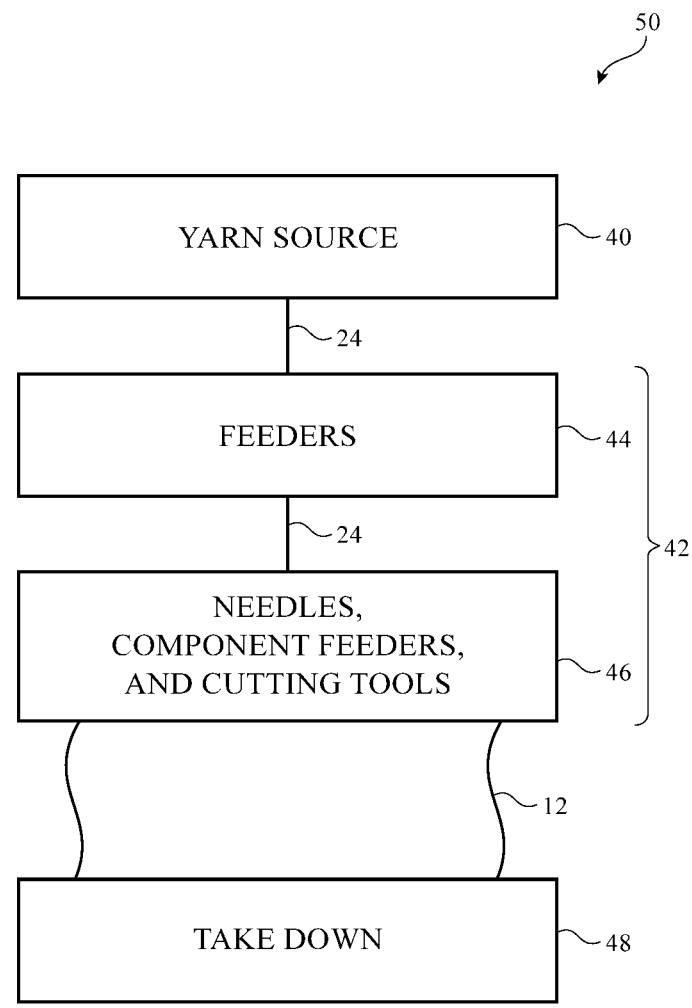
FIG. 3 is a diagram of an illustrative knitting system in accordance with an embodiment.

Knitted fabric such as knitted fabric 12 of FIG. 2 may be formed using any suitable knitting equipment. An illustrative knitting system for forming fabric 12 is shown in FIG. 3. As shown in FIG. 3, knitting equipment such as knitting system 50 may include a yarn source such as yarn source 40. Yarn source 40 may include a creel with spools of yarn 24. Knitting elements 42 may be used to knit yarn 24 into knitted fabric 12 while forming open circuits 34 and attaching electrical components 26 to selected loops of yarn 24, as described in connection with FIG. 2. Knitted fabric 12 may be gathered on drums or other take-down equipment 48.

Knitting elements 42 may include yarn guide structures such as feeders 44 that guide yarn 24 towards needles and other equipment 46. Equipment 46 may include latch needles or needles of other types, may include feeders for mounting components 26 on yarn 24, and may include cutting tools or other equipment for forming open circuits in yarn 24 (see, e.g., open circuit 34 of FIG. 2). Equipment 46 may include cam structures and other structures for manipulating the positions of needles, component mounting feeders, and/or cutting tools or other tools for open circuit formation. The needles, feeders, and tools for forming open circuits in yarn 24 may be implemented as separately adjustable components or the functionality of two or more of these tools may be combined in equipment 46. For example, a component feeder may include open circuit formation structures such as cutting structures for selectively removing metal from yarn 24. Equipment such as feeders 44 and equipment 46 (i.e., knitting elements 42) may sometimes be referred to as knitting equipment, knitting and component mounting equipment, equipment for knitting, component mounting, and open circuit formation, etc.

The use of a knitting system such as knitting system 50 of FIG. 3 to knit fabric 12 with components 26 and open circuits 34 is described in the examples of FIGS. 4-35. Other techniques for forming open circuits 34 and for mounting components 26 to loops in fabric 12 may be used, if desired.

Figure 4:
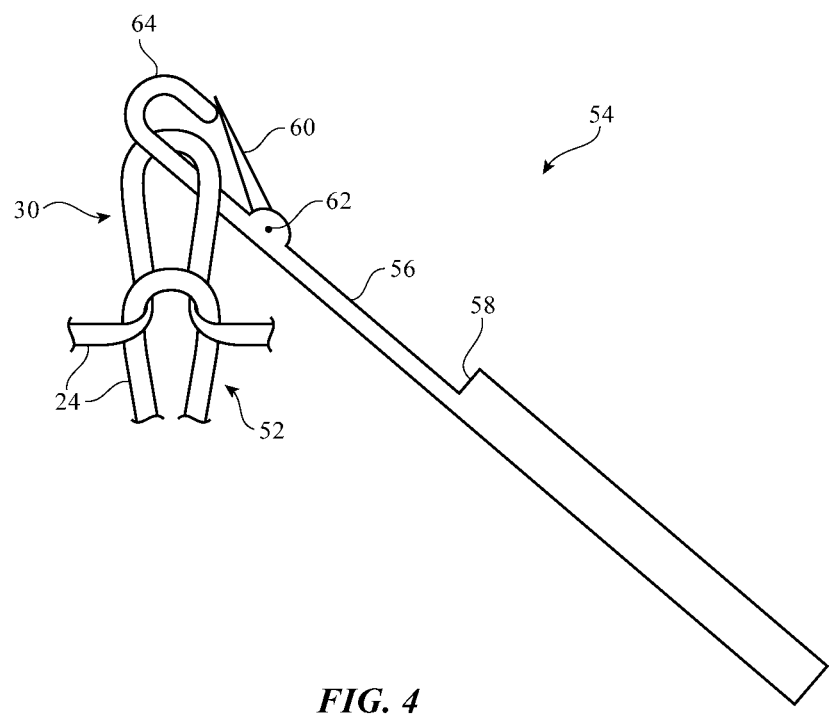
FIG. 4 shows how a latch needle may hold a knit loop of yarn in a fabric in accordance with an embodiment.

FIG. 4-18 show how system 50 may be used to knit fabric 12 while installing components 26 onto loops 30 of fabric 26. In the drawings of FIGS. 4-18, latch needle 54 and component mounting tool 68 (e.g., one of needles 46 and one of the component feeders of FIG. 3) are used to knit yarn 24 into fabric 12 while attaching components 26. As shown in FIG. 4, latch needle 54 includes a stem (shaft) such as stem 56 having a protruding portion that forms butt 58. Latch 60 is mounted to stem 56 using pivot 62. Latch needle 54 has a hook such as hook 64 that is formed from a bent tip portion of stem 56. Latch 60 may be moved between a closed position (as shown in FIG. 4) and an open position by pivoting latch 60 about pivot 62.

In the needle position of FIG. 4, loop 30 has been formed by needle 54, latch 60 is closed, and loop 30 is held in closed hook 64.

Figure 5:
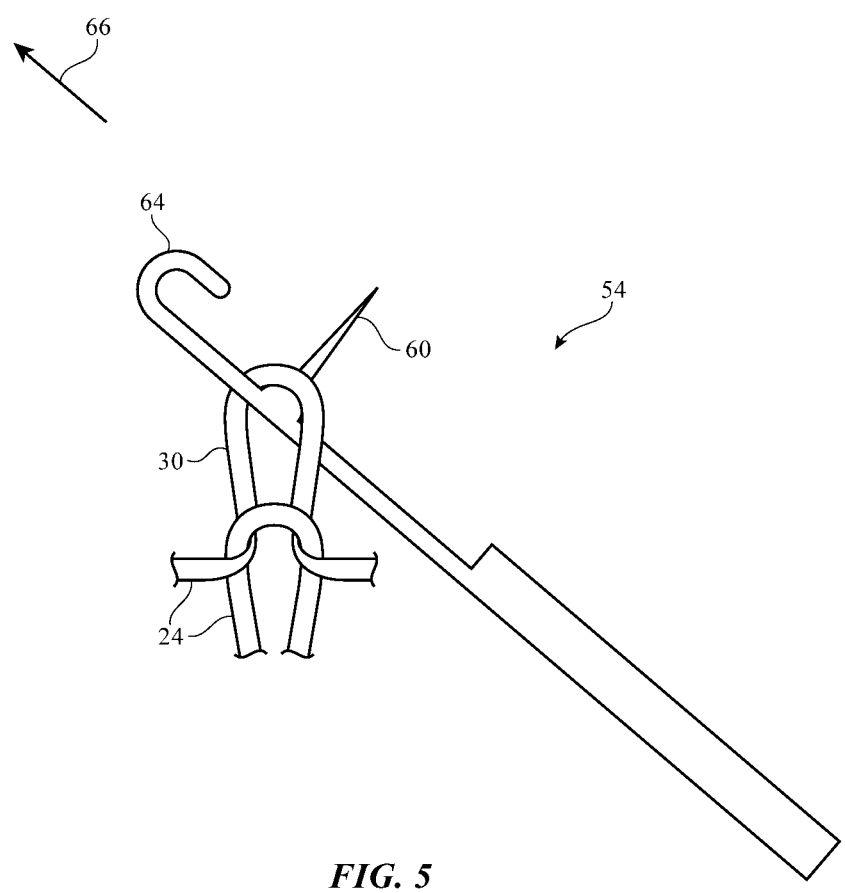
FIG. 5 shows how the latch in the needle of FIG. 4 may be opened as the needle is advanced through the loop in accordance with an embodiment.

As shown in FIG. 5, as needle 54 is advanced in direction 66, loop 30 presses against latch 60 and opens latch 60.

Figure 6:
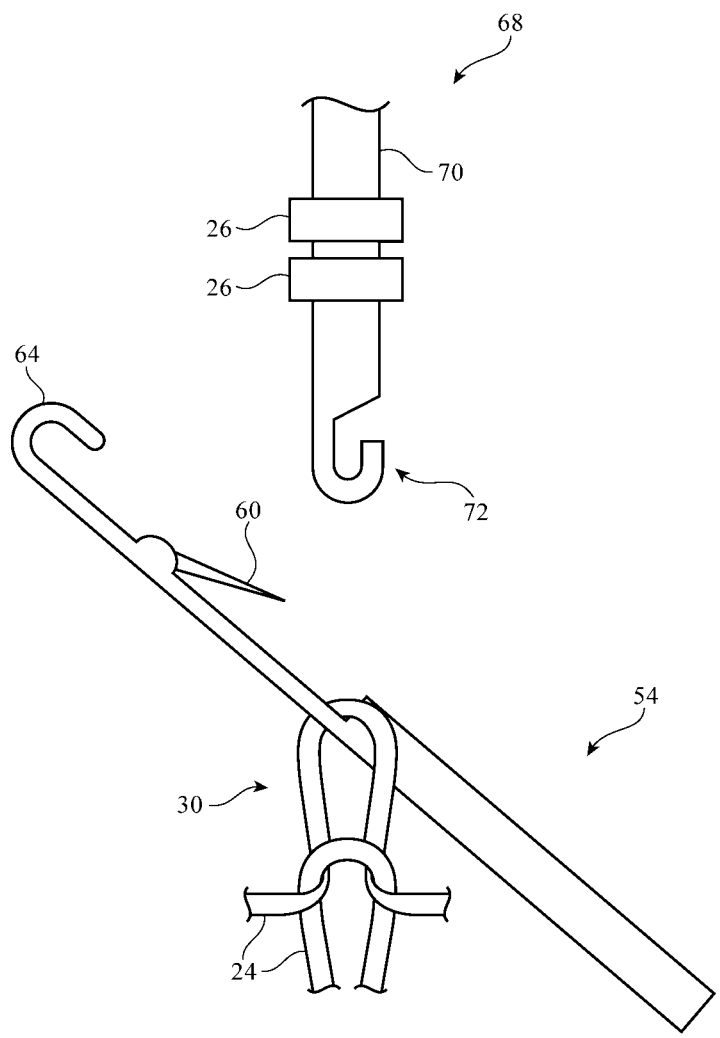
FIG. 6 shows how a component mounting tool may be advanced towards a loop in accordance with an embodiment.

Equipment 46 may include component mounting tools such as component mounting tool 68 of FIG. 6. Component mounting tool 68 may have a shaft such as shaft 70. Hook 72 may be formed at the end of shaft 70. Component mounting tool 68 may have component mounting structures for dispensing components 26 and attaching the terminals of components 26 to yarn 24. Tool 68 may, for example, include positioning equipment for moving components 26 into place and may have electrical connection formation equipment for forming electrical connections between components 26 and yarn 24. The positioning equipment may include structures that are powered by pressurized air, by vacuum suction, by electromagnetic actuators, by cams and other structures that convert translating movement of equipment such as needles, component feeders, and cutting tools into vertical movement, by electromagnets, and/or by other structures for positioning components 26 on yarn 24. The electrical connection formation equipment may include equipment for forming solder connections, welds, and cured conductive adhesive connections such as hot bar soldering structures, reflow oven structures, heat lamps, lasers, and other sources of heat and/or equipment for dispensing solder, adhesive, etc.

Figure 7:
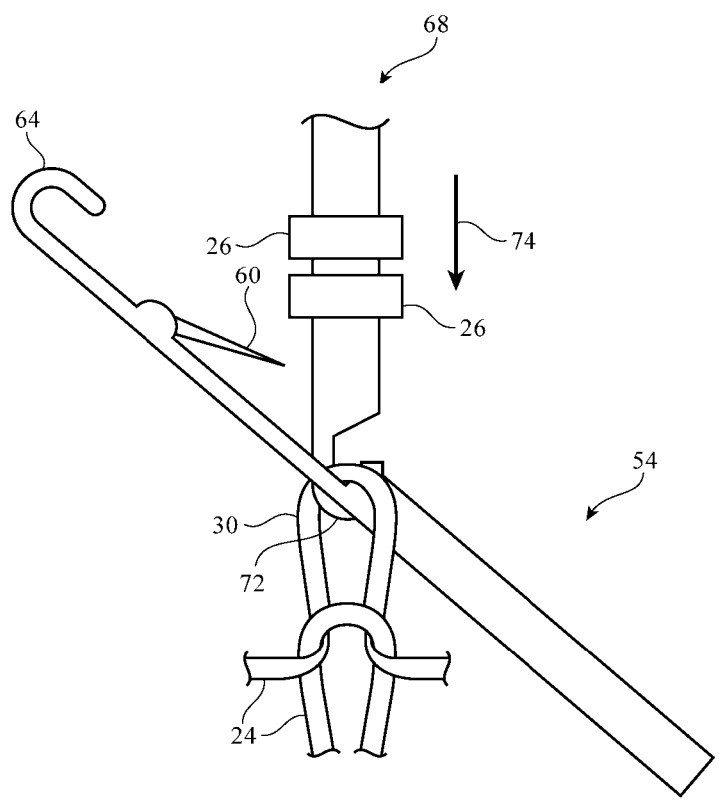
FIG. 7 shows how a hook on the component mounting tool may hold the loop in accordance with an embodiment.

As shown in FIG. 7, when component mounting tool 68 is advanced in direction 74, hook 72 of component mounting tool 68 may engage loop 30.

Figure 8:
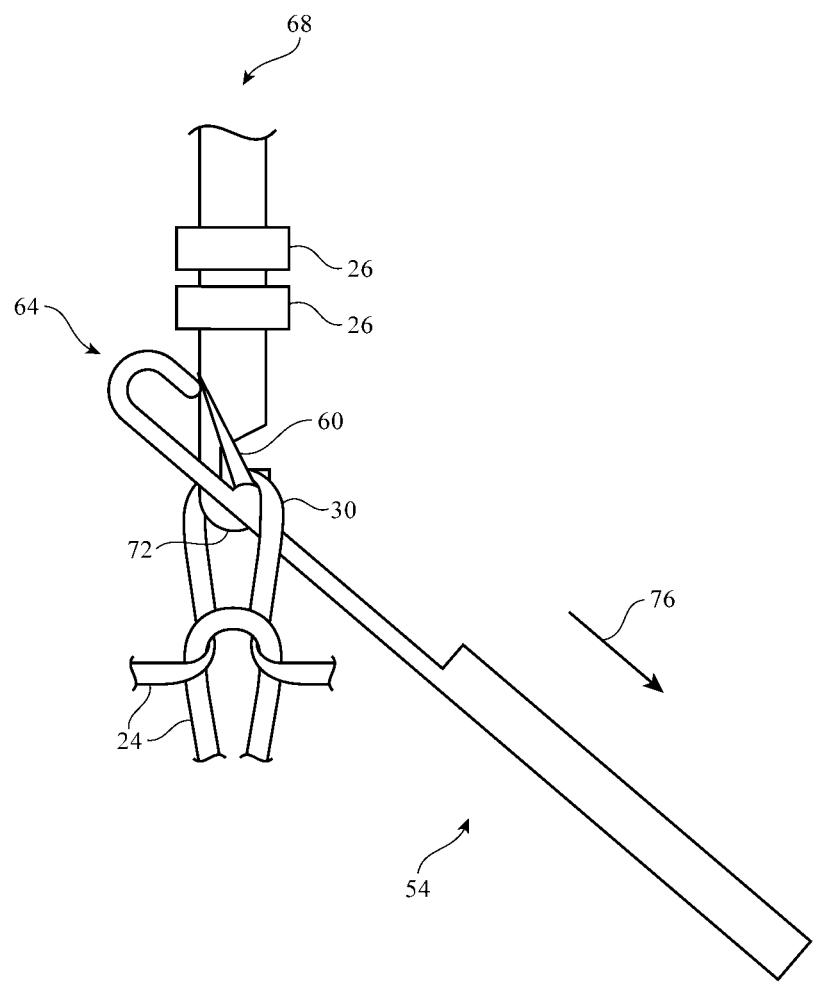

Once hook 72 has grasped the yarn of loop 30, needle 54 may be retracted in direction 76, causing loop 30 to press against latch 60 and thereby close latch 60 as shown in FIG. 8.

Figure 9:
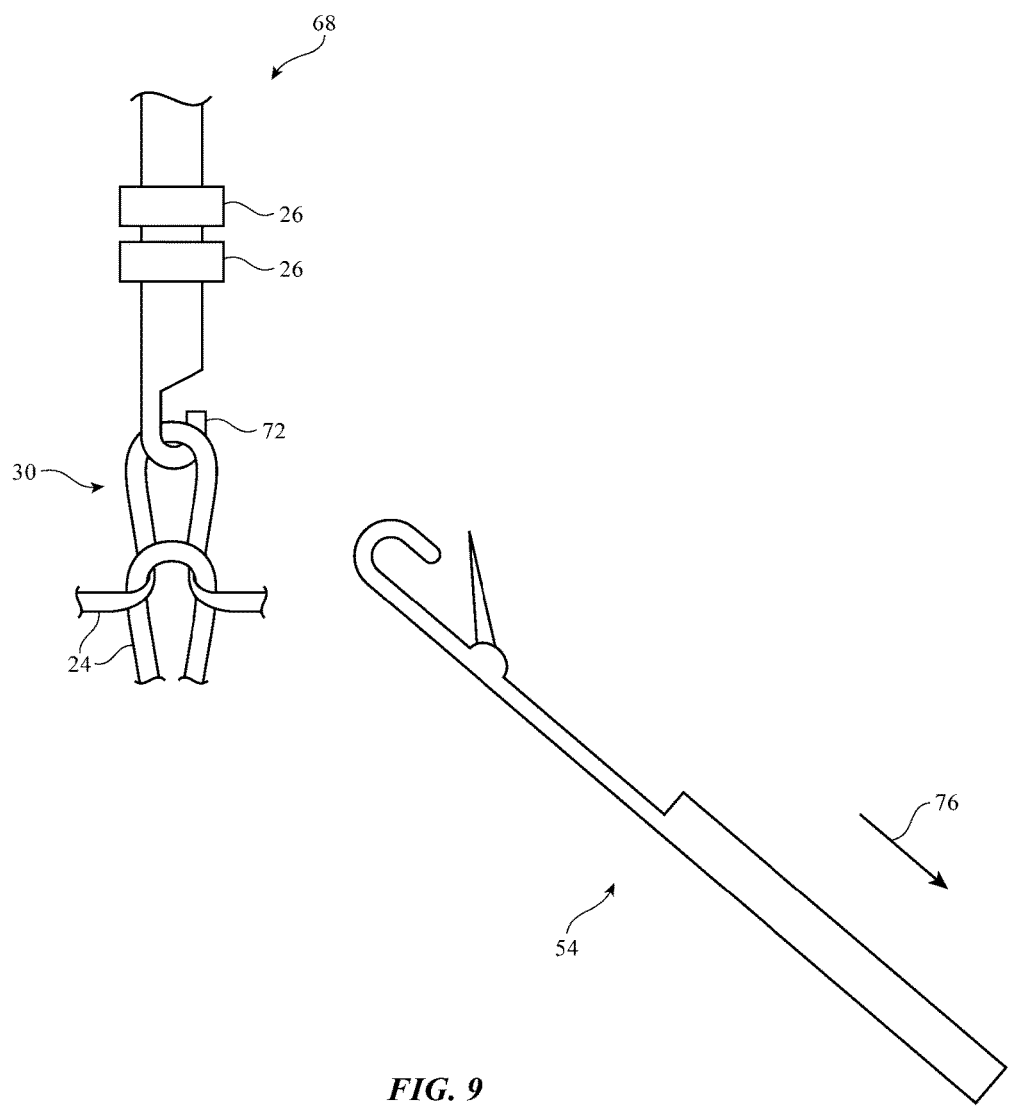

As shown in FIG. 9, after needle 54 has been completely retracted in direction 76, needle 54 will be clear of loop 30 and loop 30 will be held in place by hook 72 of component mounting tool 68 rather than hook 64 of needle 54.

Figure 10:
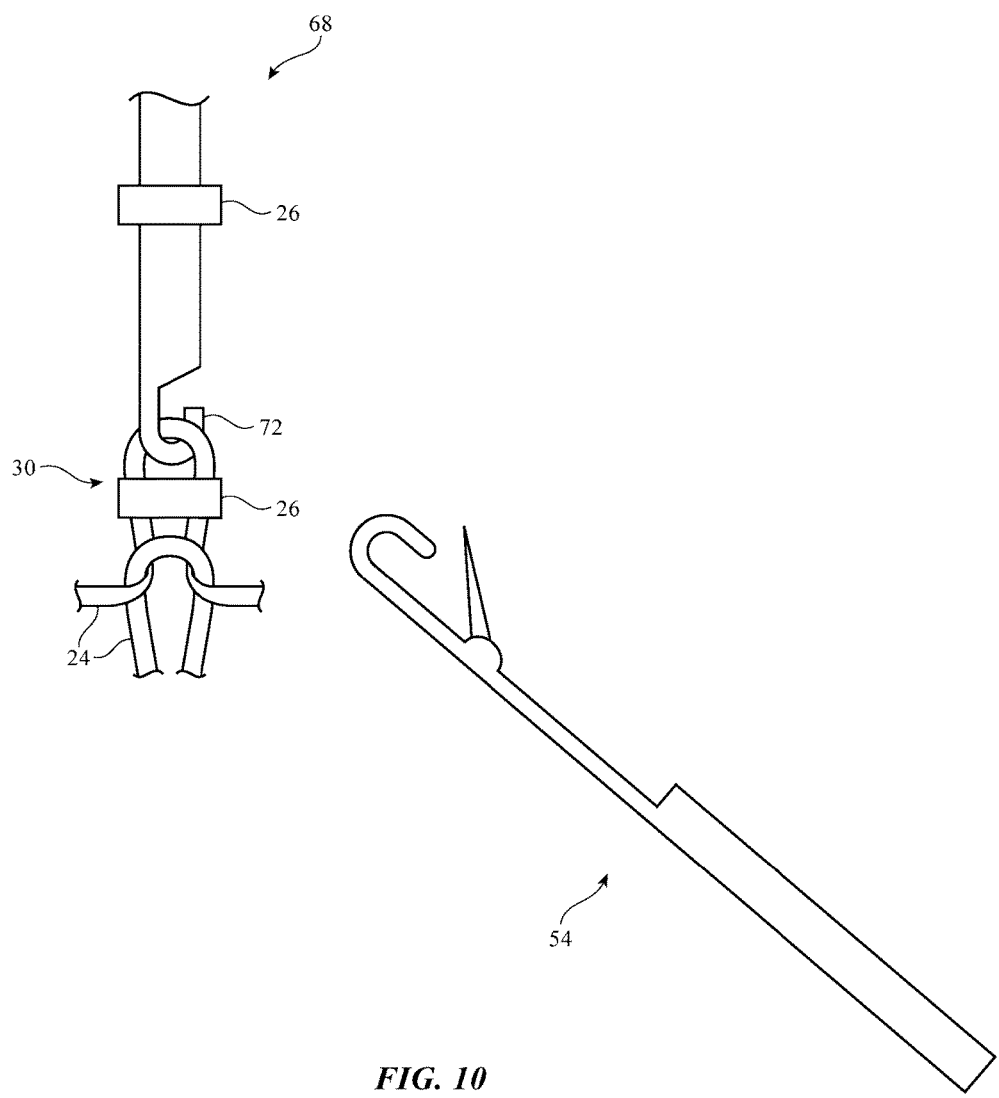
FIG. 10 shows how an electrical component may be mounted to a loop in accordance with an embodiment.

As shown in FIG. 10, component mounting tool 68 may couple a component 26 to loop 30 (e.g., using solder, welds, conductive adhesive, etc.) while hook 72 is holding loop 30, so that terminals 28 of component 26 form electrical connections to the left and right halves of loop 30, as described in connection with FIG. 2. An open circuit such as open circuit 34 of FIG. 2 may then be formed in loop 30, as described in more detail in connection with FIGS. 19-29.

Figure 11:
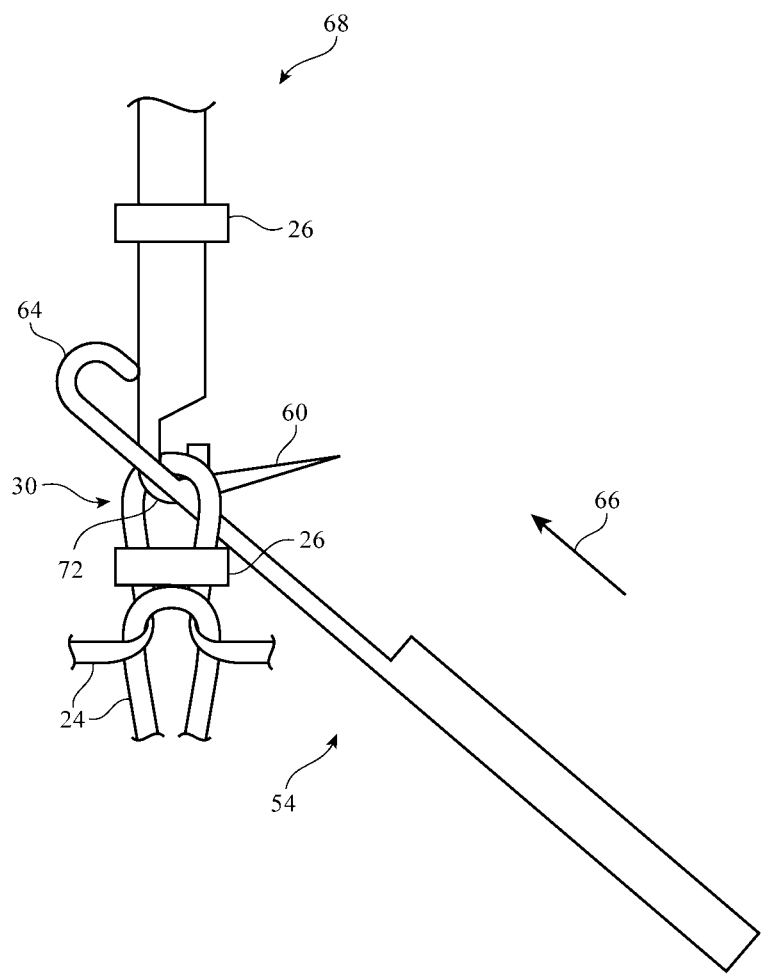
FIG. 11 shows how the needle may be introduced to the loop while the component mounting tool is holding the loop in accordance with an embodiment.

After mounting component 26 to loop 30 (and forming open circuit 34) as shown in FIG. 10, needle 54 can again be advanced in direction 66, as shown in FIG. 11. This causes hook 64 to pass through loop 30 and causes latch 60 to open as the yarn of loop 30 presses against latch 60.

Figure 12:
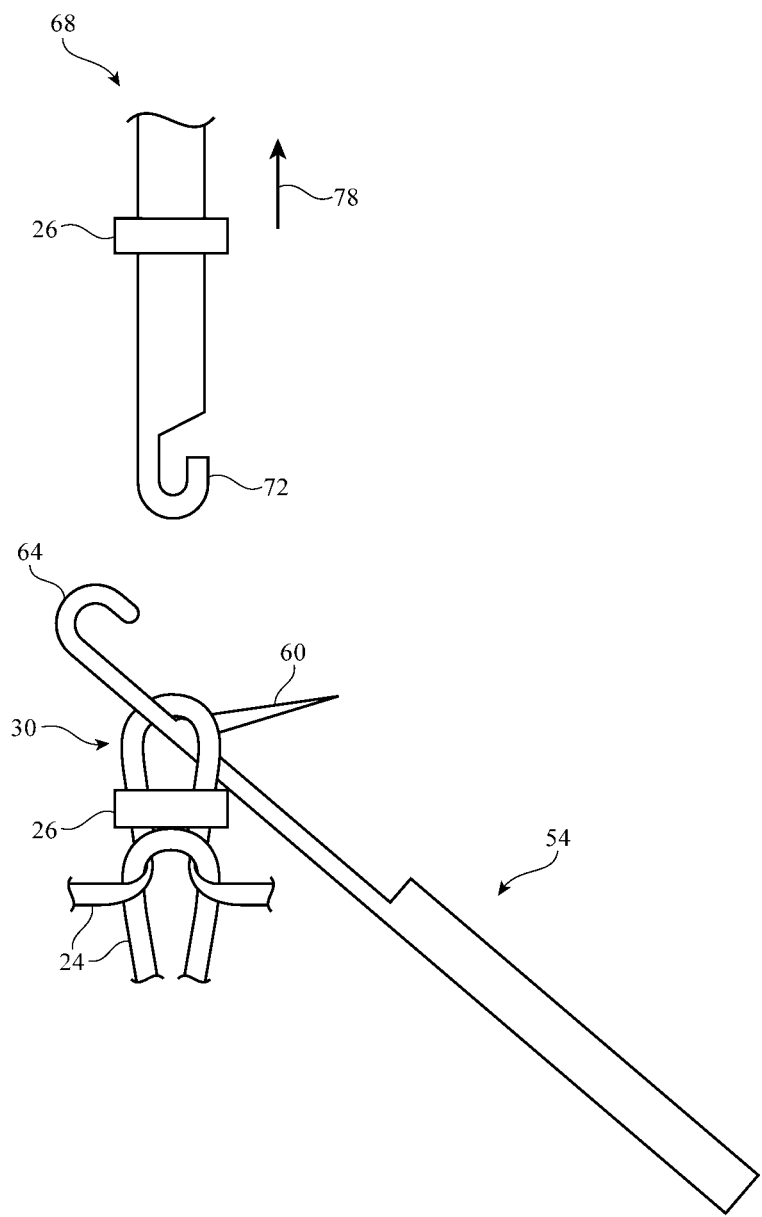
FIG. 12 shows how the component mounting tool may be retracted while the needle is holding the loop in accordance with an embodiment.

As shown in FIG. 12, needle 54 may hold loop 30 in position while component mounting tool 68 is retracted in direction 78.

Figure 13:
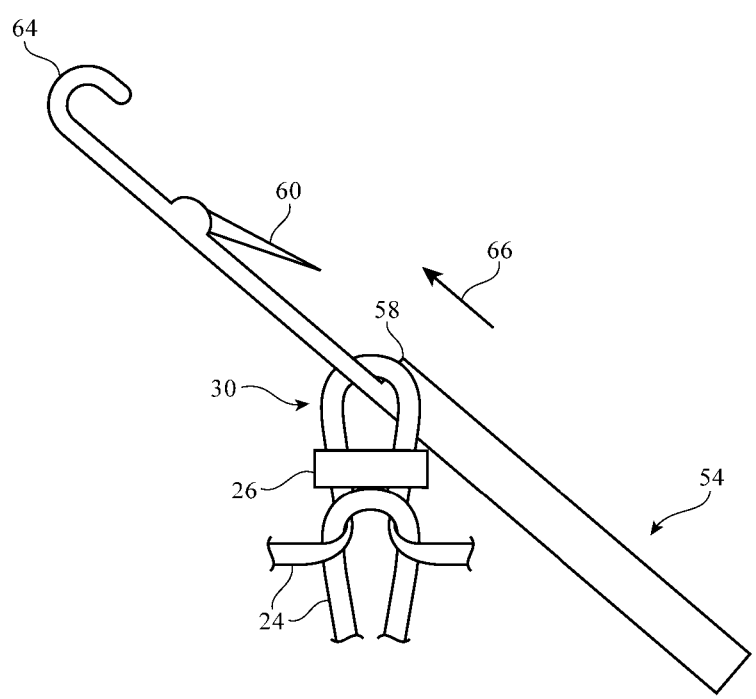
FIG. 13 shows how the needle may be advanced after retracting the component mounting tool in accordance with an embodiment.
Figure 14:
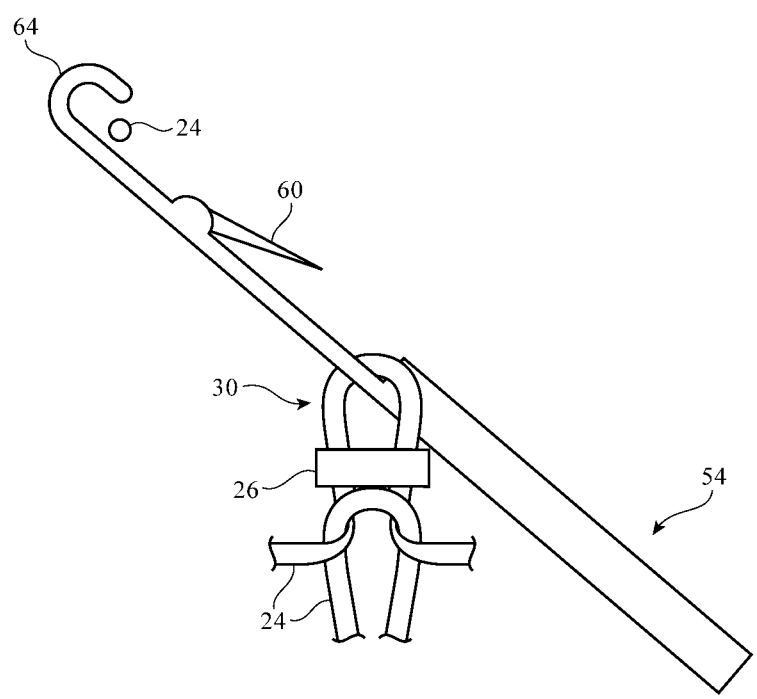
FIG. 14 is a diagram showing how a hook on the needle may receive a yarn in accordance with an embodiment.

After retracting component mounting tool 68, needle 54 may be advanced farther in direction 66 until butt 58 presses against loop 30, as shown in FIG. 13. Another yarn 24 may then be received by hook 64 of needle 54, as shown in FIG. 14.

Figure 15:
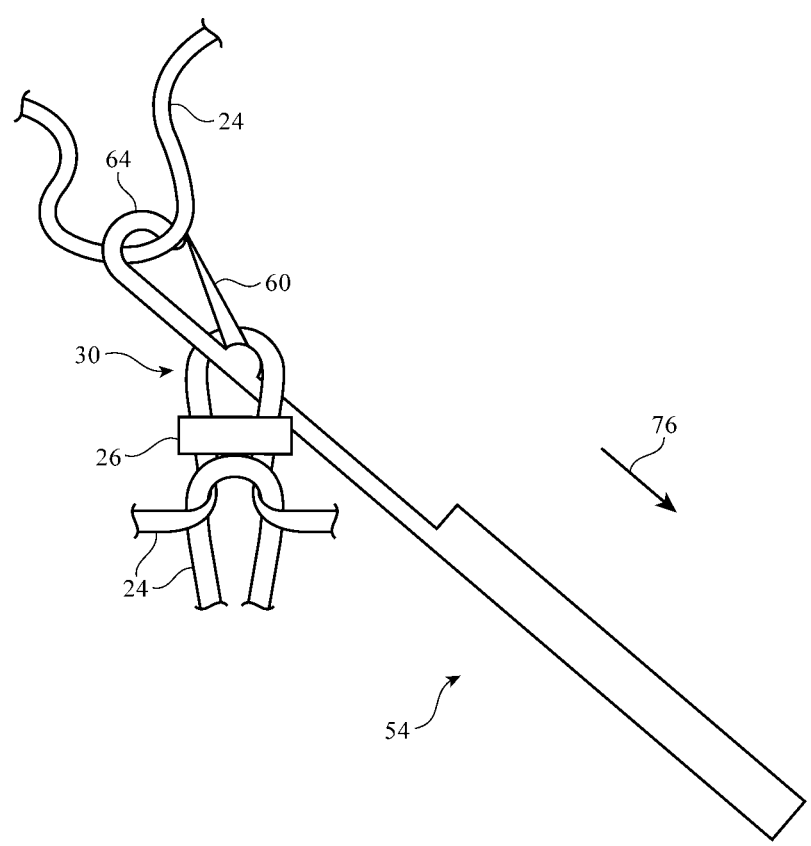
FIGS. 15, 16, 17, and 18 are diagrams showing how the hook with the received yarn may be used to form a new loop in accordance with an embodiment.

Retraction of needle 54 in direction 76 cause the yarn of loop 30 to press against latch 60, thereby closing latch 60 against hook 64 to retain the newly received yarn 24 within hook 64, as shown in FIG. 15.

Figure 16:
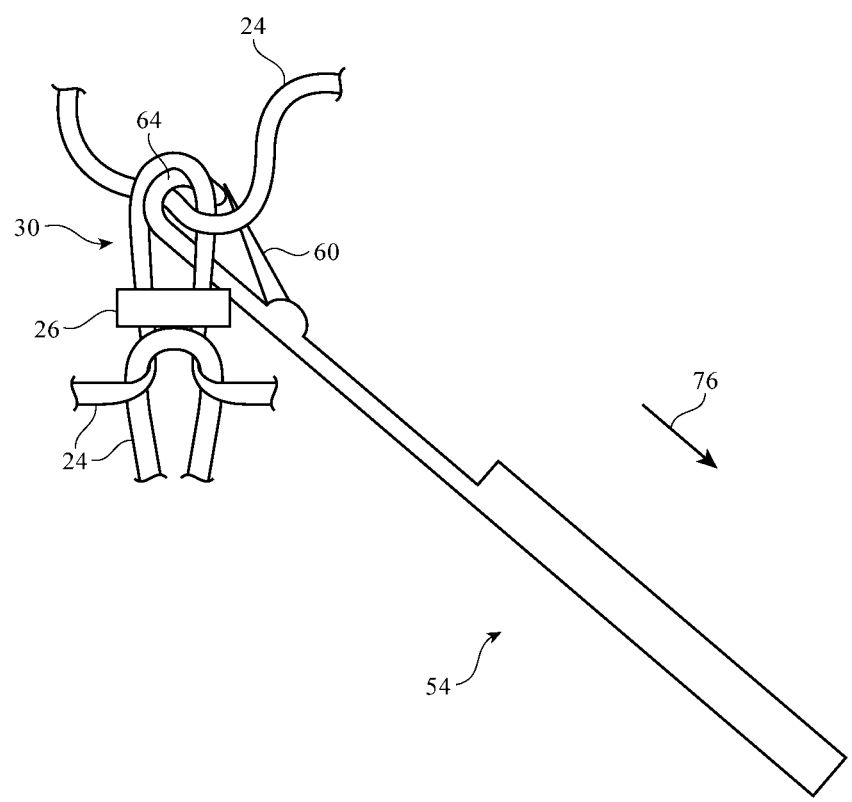
Figure 17:
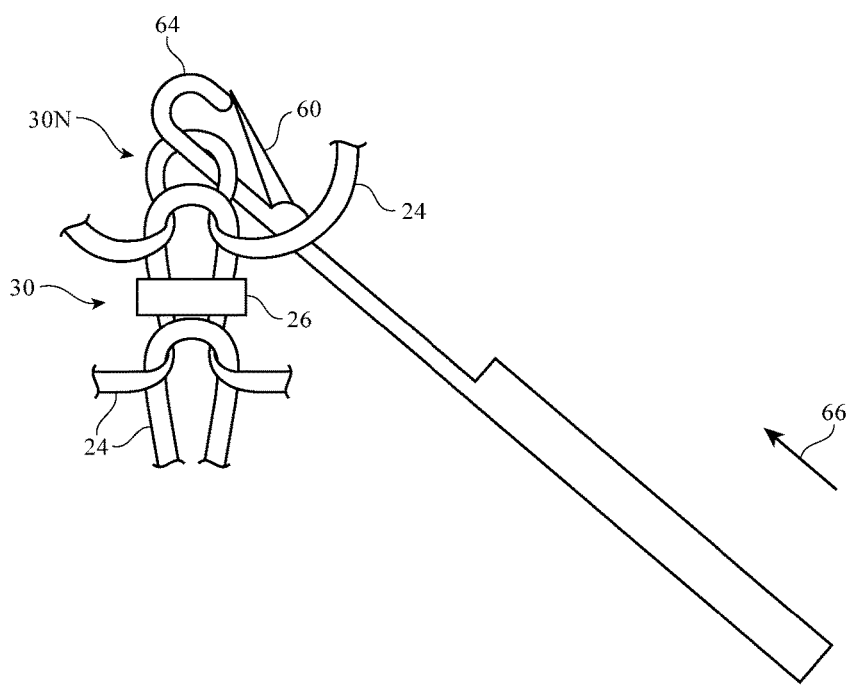
Figure 18:
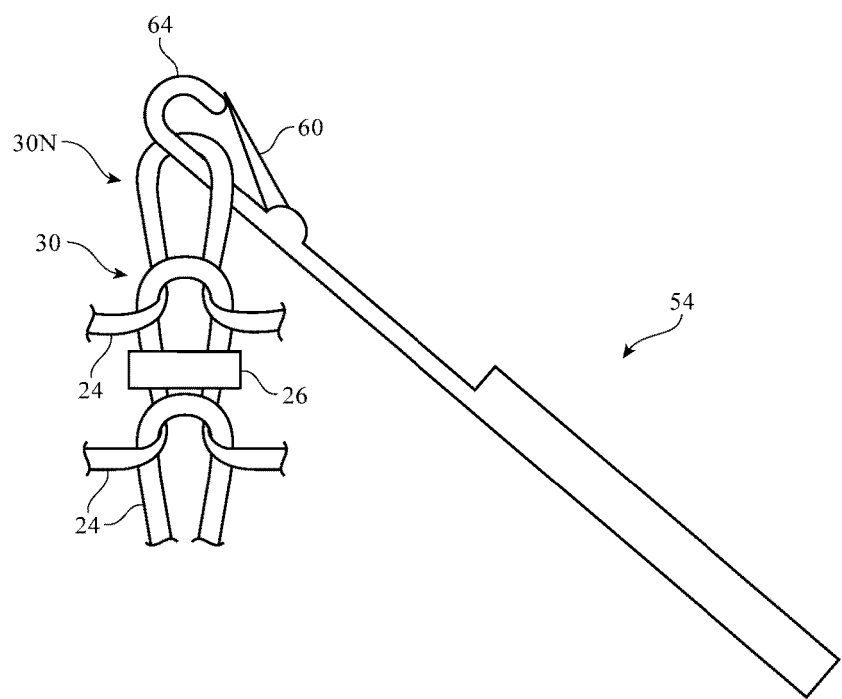

Further retraction of needle 54 in direction 76 causes latch 60, hook 64, and the yarn held by hook 64 to pass through loop 30, as shown in FIG. 16. Needle 54 may then be advanced in direction 66 to form a new loop of yarn 24 such as new loop 30N of FIG. 17. When needle 54 reaches the position of FIG. 18, a knitting cycle has been completed (i.e., the fabric and needle configuration of FIG. 18 is the same as that of FIG. 4). Further cycles may be performed (with our without component mounting using tool 68) until the knitting of fabric 12 is complete.

Open circuits such as open circuit 34 of FIG. 2 may be formed during the knitting operations of FIGS. 4-16. Open circuit formation operations are illustrated separately in FIGS. 19-29 for clarity.

Figure 19:
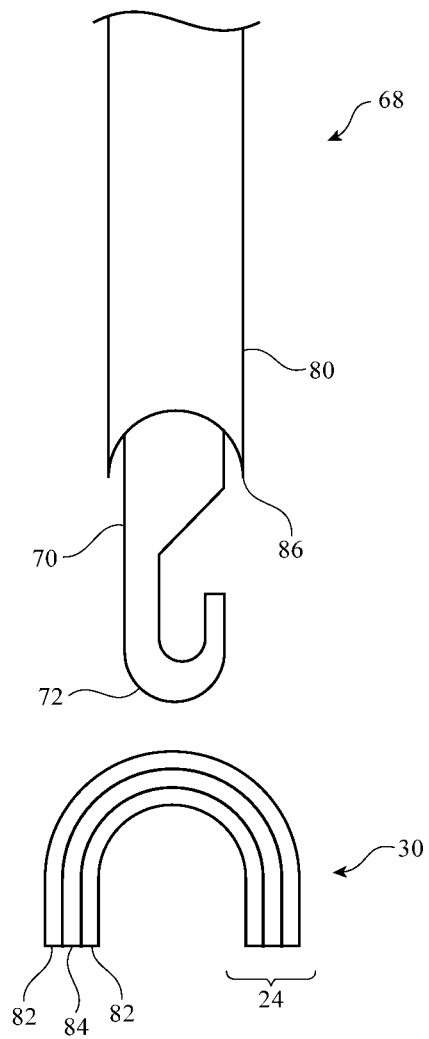
FIGS. 19, 20, 21, and 22 show how a component mounting tool with a sheath or other structures for forming an open circuit may have a hook that forms a loop in accordance with an embodiment.

When forming fabric 12, some of yarns 24 may be conductive (e.g., those yarns onto which it is desired to mount components 26). Remaining yarns 24 may be either conductive or non-conductive. As shown in FIG. 19, conductive yarn 24 in loop 30 may be formed using an insulating portion such as insulating core 84 and a conductive portion such as metal layer 82 or other conductive coating. Strands of material in fabric 12 may have a single filament (as shown by yarn 24 in FIG. 19) or may have multiple filaments.

Component mounting tool 68 may include open circuit formation capabilities. For example, conductive yarns may have insulating polymer cores or other strands of dielectric covered with a conductive metal coating. Tool 68 may include a metal remover such as metal remover 80. Metal remover 80 may use heat, light (e.g., laser light), electricity, abrasion, cutting (wire stripping motions), or other suitable techniques to selectively remove a portion of the conductive metal coating away from an insulating polymer core in the yarn of loop 30 to form open circuit 34. As an example, metal remover 80 may be formed from a metal sheath with a sharp leading edge such as cutting edge 86 in the example of FIG. 19 that can advance towards hook 72 at the end of shaft 70 of tool 68 or that can retract away from hook 72. The use of a tool such as component mounting tool (and open circuit formation tool) 68 of FIG. 19 may sometimes be described herein as an example. In general, equipment 46 of system 50 may use any suitable tool for attaching components 26 to loops 30 and for forming open circuits 34 in loops 30. Tool 68 of FIG. 19 is merely illustrative.

Initially, tool 68 may be in a retracted position so that loop 30 is not received within hook 72 (FIG. 19).

Figure 20:
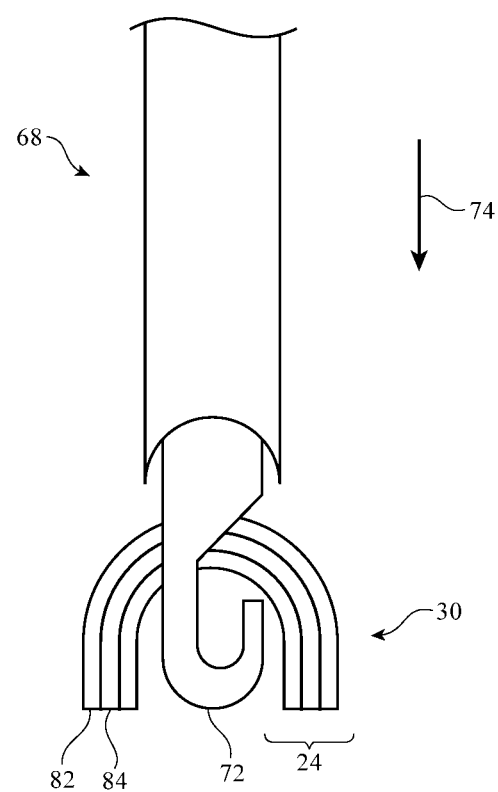
Figure 21:
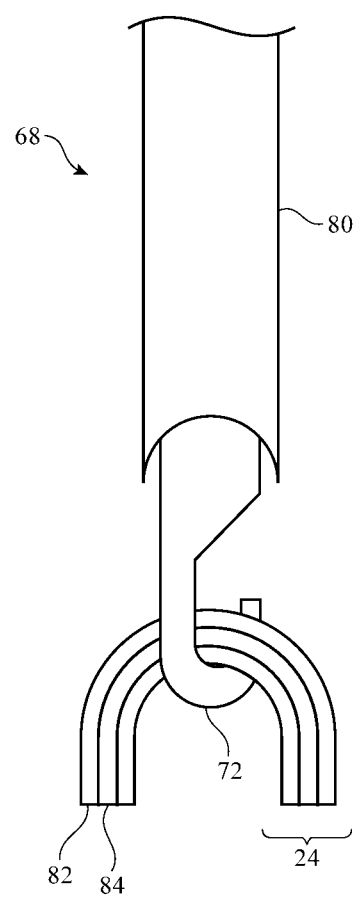
Figure 22:
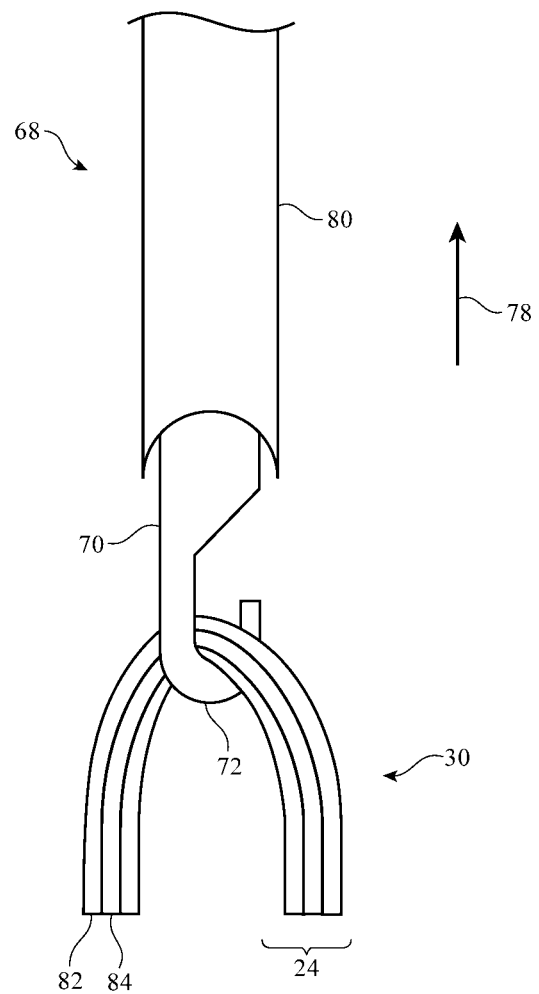

As shown in FIG. 20, tool 68 may be advanced towards loop 30 in direction 74 so that hook 72 can receive loop 30 (FIG. 21). Tool 68 may then be retracted in direction 78 to enlarge loop 30, as shown in FIG. 22.

Figure 23:
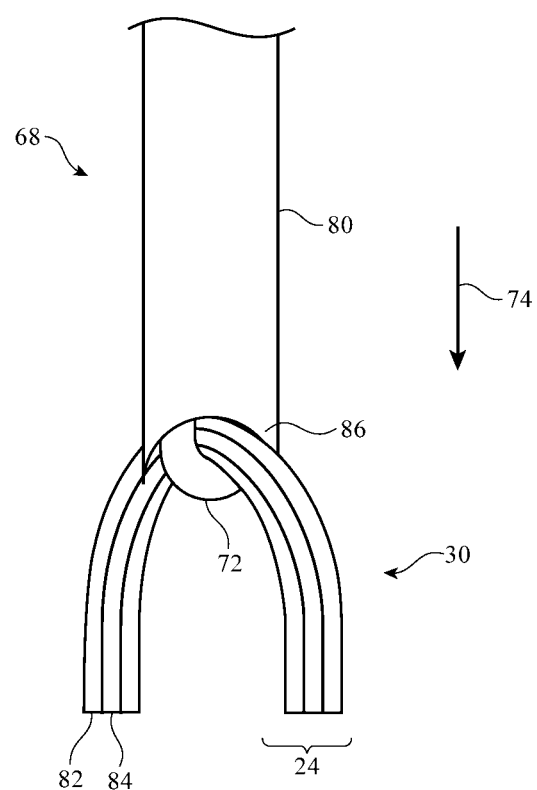
FIGS. 23, 24, and 25 show how an open circuit may be formed in the loop by removing a metal coating layer from a portion of a dielectric core in accordance with an embodiment.
Figure 24:
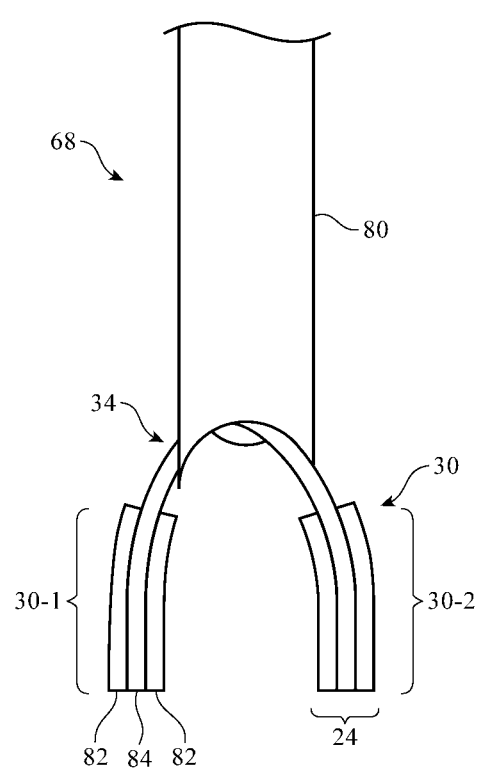
Figure 25:
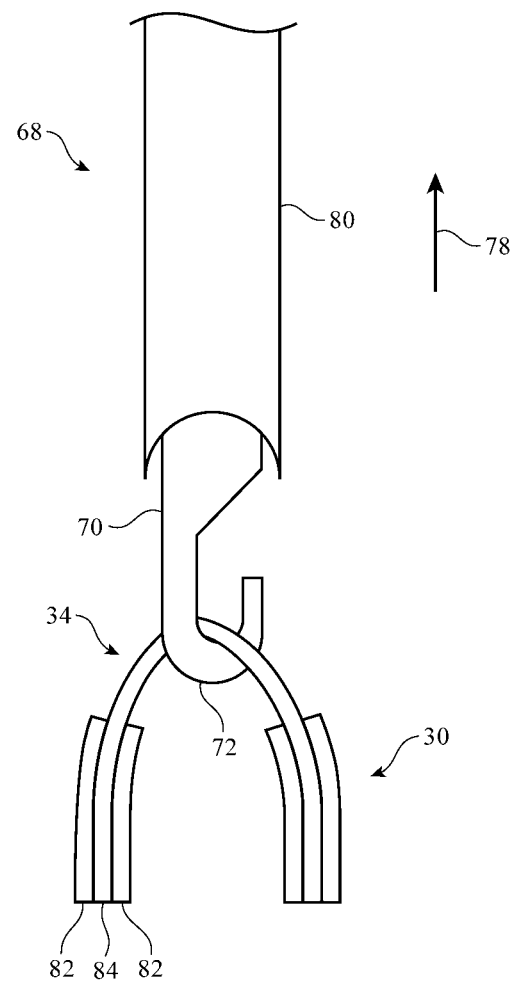

After forming loop 30, metal remover 80 may remove a portion of metal coating 82 in a localized area of loop 30 to form open circuit 34. As shown in FIG. 23, for example, metal remover 80 may be a metal sheath this is advanced over shaft 70 and hook 72 of tool 68 until cutting edge 86 of the sheath cuts away coating 82 from yarn 24. This leaves a portion of yarn 24 in loop 30 between loop portions 30-1 and 30-2 free of metal coating 82 (i.e., a gap is formed in metal coating 82), thereby forming open circuit 34, as shown in FIG. 24. The metal sheath may then be retracted in direction 78 to expose hook 72 and the tip of shaft 70, as shown in FIG. 25.

Figure 26:
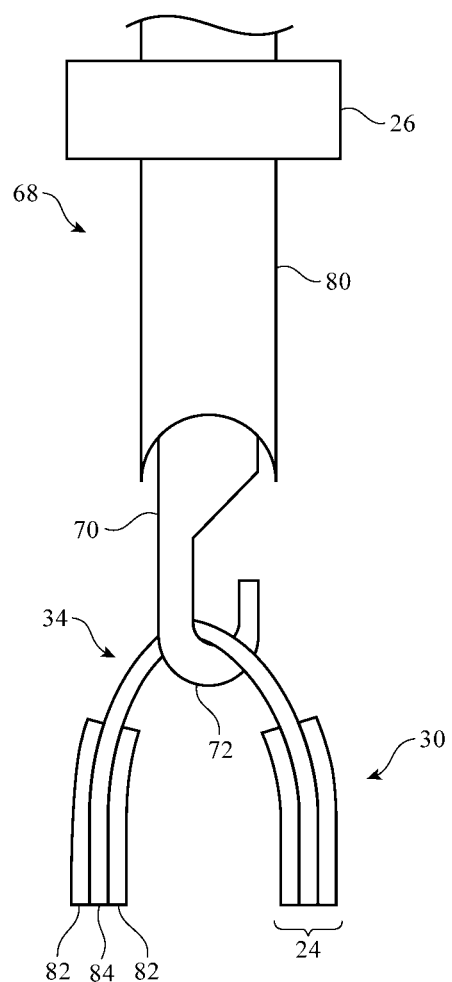
FIGS. 26, 27, 28, and 29 show how a component may be mounted to the loop in a location that spans the open circuit in accordance with an embodiment.
Figure 27:
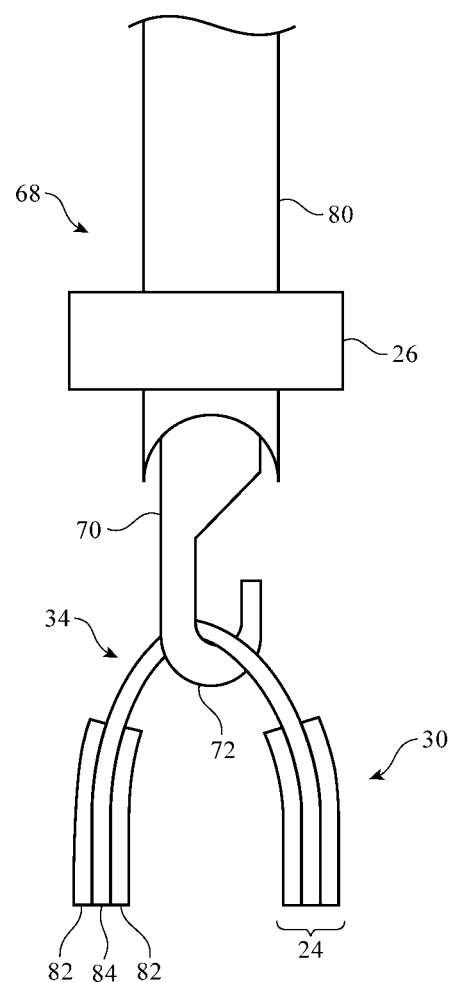
Figure 28:
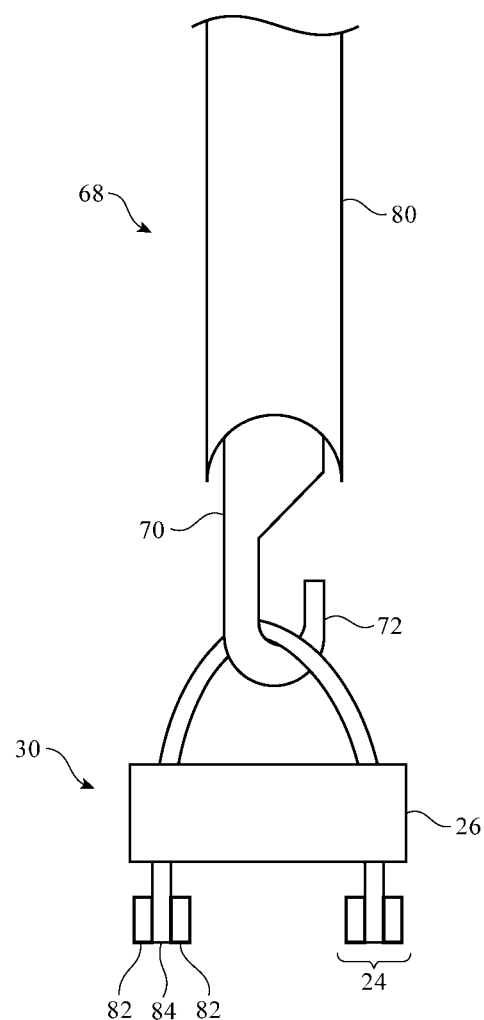

FIGS. 26, 27, and 28 show how component 26 may be advanced along tool 68 and mounted on loop 30, as described in connection with FIGS. 9 and 10. Soldering, welding, conductive adhesive attachment techniques, crimping, or other suitable techniques may be used to attach and thereby short terminals 28 of component 26 to the conductive material (metal coating 82) in yarn 24 of loop 30.

Figure 29:
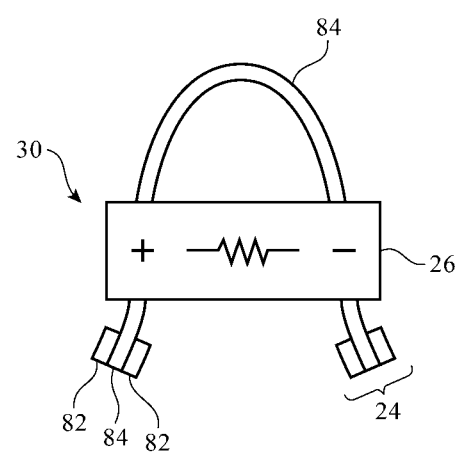

FIG. 29 shows how loop 30 may appear after component 26 has been mounted to loop 30. The presence of open circuit 32 allows signals to be conveyed through component 26 using the conductive metal coating on the left and right sections of yarn 24.

If desired, fabric 12 may be formed from multiple yarns 24 and techniques such as intarsia and plating may be used to create fabric 12 in which components 26 are located and/or made visible in selected portions of fabric 12. For example, in an intarsia scheme, components 26 may be attached to a first yarn and not to a second yarn. Areas of fabric 12 in which it is desired to include components 26 may be formed using the first yarn. Areas of fabric 12 in which it is not desired to include components 26 may be formed using the second yarn.

As another example, a plating technique of the type shown in FIGS. 30-35 may be used to form fabric 12. Using this technique, components 26 on the first yarn may be hidden from view in some areas of fabric 12 by placing the second yarn in front of the first yarn and may be exposed to view in other areas of fabric 12 by placing the first yarn in front of the second yarn (as an example).

Figure 30:
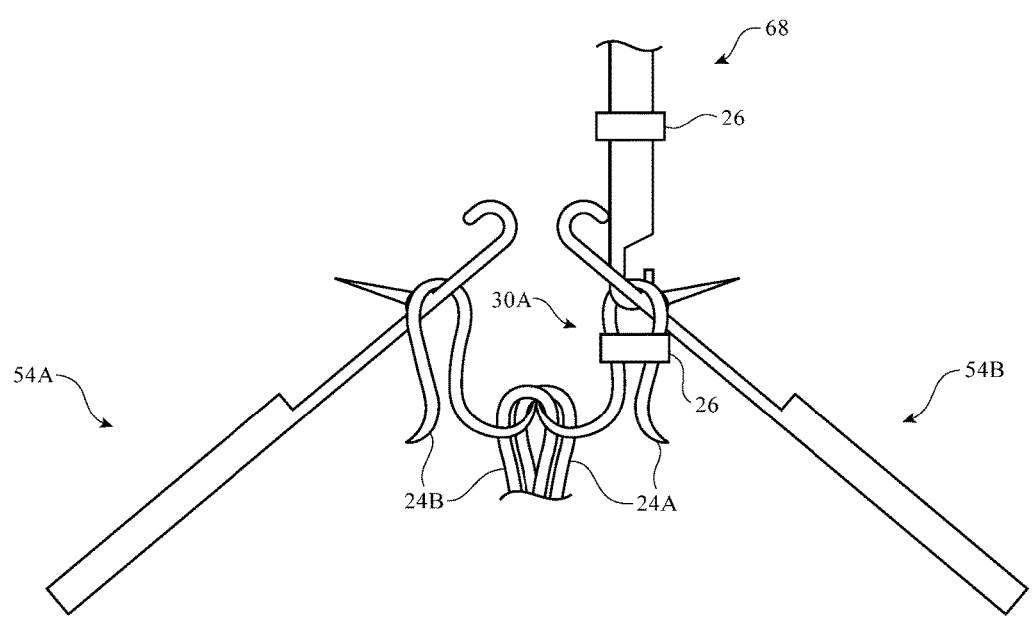
FIGS. 30, 31, 32, 33, 34, and 35 show how an electrical component can be attached to a loop that is placed behind another loop in a knit fabric in accordance with an embodiment.
Figure 31:
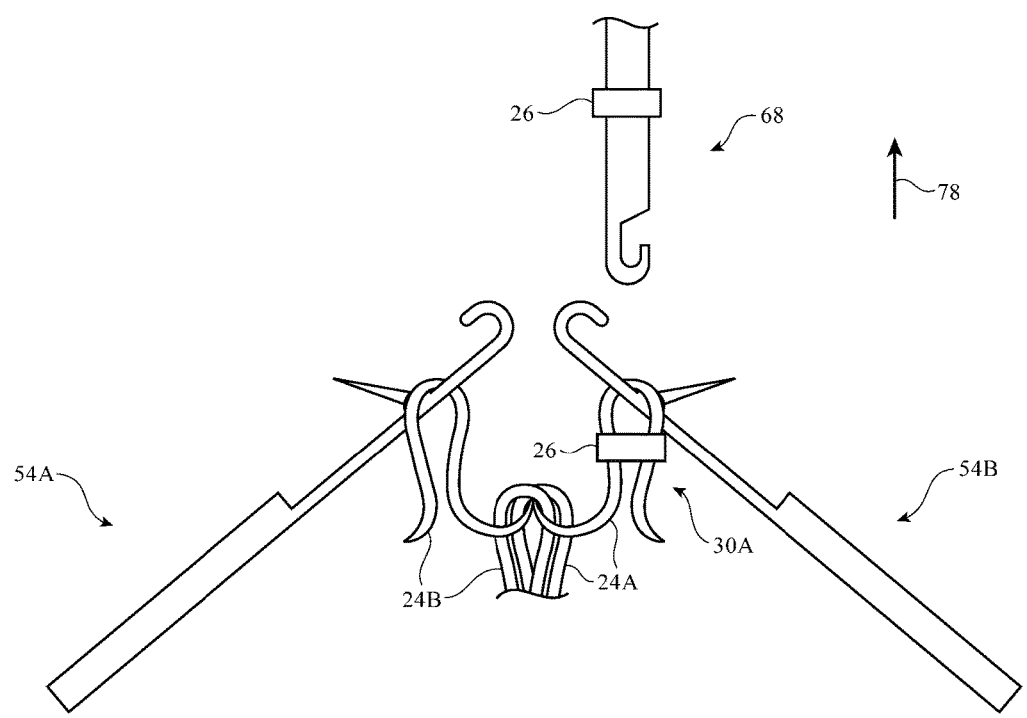
Figure 32:
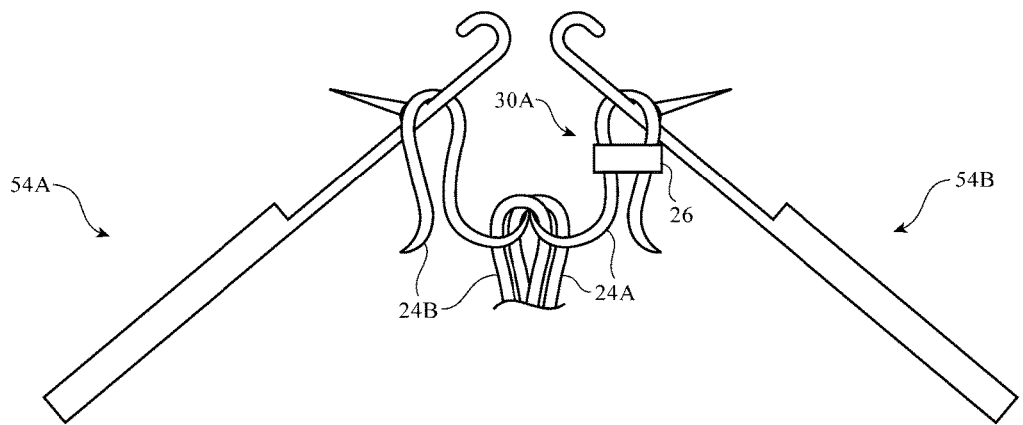

As shown in FIG. 30, needles 54A and 54B may be used in knitting fabric 12 from first yarn 24A and second yarn 24B. Components 26 may be mounted on first yarn 24A using component mounting tool 68. Component mounting tool 68 may then be retracted in direction 78 (FIGS. 31 and 32).

Figure 33:
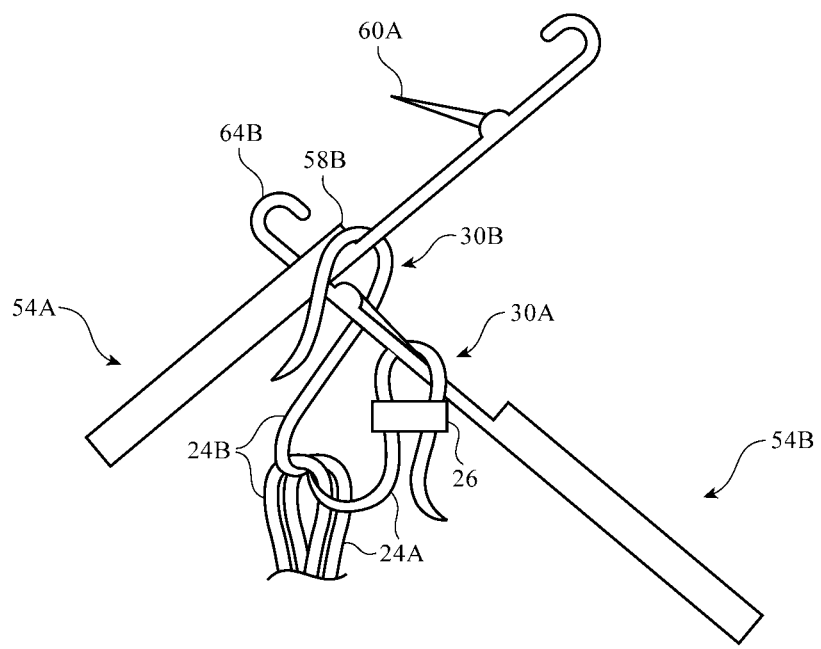
Figure 34:
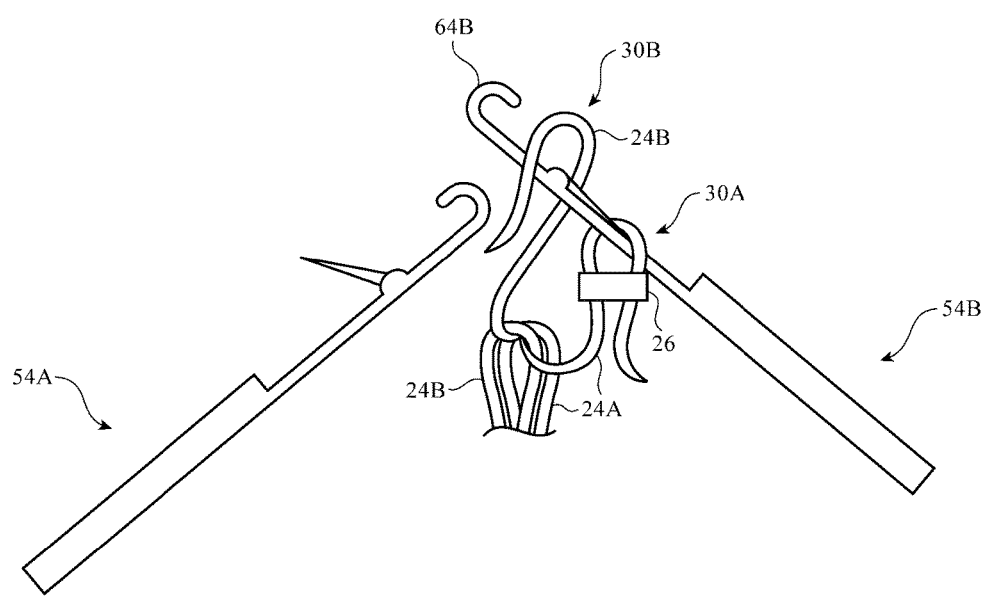

As shown in FIG. 33, left needle 54A may be advanced so that latch 60A of needle 54A clears loop 30B of yarn 24B and so that butt 58A of needle 54A advances yarn 24B to a position where loop 30B of yarn 24B may be grasped by hook 64B of needle 54B. Needle 54A may then be retracted (FIG. 34).

Figure 35:
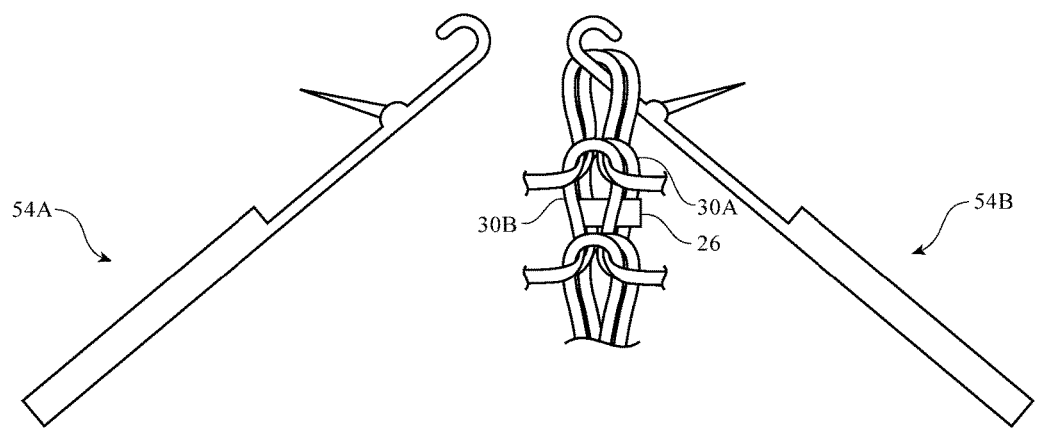

As shown in FIG. 35, in completed fabric 12, loops formed from second yarn 24B such as loop 30B may be placed in front of loops formed from first yarn 24A such as loop 30A. Components 26 are mounted on loops 30A, so the arrangement of FIG. 35 allows second yarn loops 30B to cover components 26 on loops 30A (i.e., the layer of knitted fabric 12 formed from loops 30B will be on the outside of fabric 12 and will be visible to a user, whereas the layer of knitted fabric 12 formed from loops 30A and components 26 on loops 30A will be on the inside of fabric 12 and will not be visible to a user). If desired, the relative positions of loops 30A and 30B (and therefore the exposure of components 26) may be varied as a function of position in fabric 12. In some areas, components 26 may be hidden from view by an exterior layer of knitted loops, whereas in other areas, components 26 may be exposed to view and may be uncovered (i.e., not covered by loops 30B).

When hiding components 26, loops 30B may be formed from opaque material on the outside of fabric 12 that blocks underlying loops 30A on the inside of fabric 12 from view. If desired, loops 30B may be formed from transparent material (e.g., clear low-haze material, translucent material, colored transparent material, etc.). In this type of configuration, light that has been emitted by components 26 (e.g., light-based components such as light-emitting diodes) may pass through overlapping loops 30A or light that has passed through loops 30A may be received by components 26 (e.g., light-based components such as light detectors). If desired, some of the loops in fabric 12 may be formed from opaque material and some of the loops in fabric 12 may be formed from transparent material. Configurations in which all of yarns in fabric 12 are opaque or are transparent may also be used.

The foregoing is merely illustrative and various modifications can be made by those skilled in the art without departing from the scope and spirit of the described embodiments. The foregoing embodiments may be implemented individually or in any combination.

What is claimed is:

1. A fabric-based item comprising:
   fabric having knit loops; and
   an electrical component having first and second terminals coupled respectively to first and second portions of one of the loops.

2. The fabric-based item defined in claim 1 wherein the loop to which the first and second terminals are coupled has an insulating core and a conductive coating.

3. The fabric-based item defined in claim 2 wherein the conductive coating is absent from a portion of the loop between the first and second terminals.

4. The fabric-based item defined in claim 1 wherein a given one of the knit loops overlaps the electrical component and the loop to which the first and second terminals are coupled.

5. The fabric-based item defined in claim 4 wherein the knit loop that overlaps the component is opaque.

6. The fabric-based item defined in claim 4 wherein the knit loop that overlaps the component is transparent.

7. The fabric-based item defined in claim 1 wherein the first portion includes a strand of material with a polymer core coated with a metal coating to which the first terminal is shorted, wherein the second portion includes a strand of material with a polymer core with a metal coating to which the second terminal is shorted, wherein an open circuit is formed in the loop between the first and second portions, and wherein the metal coatings of the first and second portions carry a signal that passes through the electrical component.

8. The fabric-based item defined in claim 7 wherein the electrical component includes a light-emitting diode.

9. The fabric-based item defined in claim 7 wherein the electrical component comprises an integrated circuit.

10. A knit fabric, comprising:
    rows of interlocking loops of yarn, wherein the yarn includes an insulating core covered with metal; and
    at least one electrical component having terminals that are shorted to the metal, wherein the terminals of the electrical component are coupled to the metal on opposing sides of an open circuit in the metal.

11. The knit fabric defined in claim 10 wherein the terminals include a first terminal shorted to a first portion of a given one of the loops and a second terminal shorted to a second portion of the given one of the loops, wherein the open circuit in the metal is formed from a portion of the yarn in which the insulating core is free of the metal, and wherein the portion of the yarn that is free of the metal is between the metal of the first portion and the metal of the second portion.

12. The knit fabric defined in claim 11 wherein the electrical component comprises a light-emitting diode that receives a signal that passes through the metal of the first and second portions of the given loop.

13. The knit fabric defined in claim 11 wherein the electrical component comprises an integrated circuit.

14. The knit fabric defined in claim 10 wherein the electrical component comprises a light-based component and wherein the open circuit in the metal comprises a portion of the yarn from which metal has been removed.

15. A method of forming a fabric-based item, comprising:
    knitting conductive strands of material to form a fabric with a knitting system; and
    while knitting the conductive strands with the knitting system, forming open circuits in selected portions of the conductive strands and attaching electrical components to the conductive strands that span the open circuits so that signals that are carried by the conductive strands pass through the electrical components.

16. The method defined in claim 15 wherein the conductive strands of material each include an insulating core covered with a metal coating and wherein forming the open circuits comprises removing the metal coating from the selected portions of the conductive strands.

17. The method defined in claim 16 wherein each of the electrical components has first and second terminals that are shorted to respective first and second portions of a corresponding one of the conductive strands on opposing sides of an associated one of the open circuits.

18. The method defined in claim 15 wherein knitting the conductive strands comprises forming loops in the conductive strands and wherein each of the electrical components comprises respective first and second terminals.

19. The method defined in claim 18 wherein attaching the electrical components comprises attaching the first and second terminals of each of the electrical components to respective first and second portions of the loops using solder.

20. The method defined in claim 15 wherein the electrical components include light-emitting diodes and wherein attaching the electrical components comprises attaching the electrical components that include the light-emitting diodes.

* * * * *